(12) United States Patent
Clark et al.

(10) Patent No.: US 8,946,667 B1
(45) Date of Patent: Feb. 3, 2015

(54) BARRIER STRUCTURE FOR A SILVER BASED RRAM AND METHOD

(75) Inventors: Mark Harold Clark, Santa Clara, CA (US); Steven Maxwell, Sunnyvale, CA (US); Harry Gee, Sunnyvale, CA (US); Natividad Vasquez, San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/447,036

(22) Filed: Apr. 13, 2012

(51) Int. Cl.
| H01L 29/02 | (2006.01) |
| H01L 47/00 | (2006.01) |
| H01L 29/04 | (2006.01) |
| H01L 29/06 | (2006.01) |
| H01L 47/02 | (2006.01) |
| H01L 21/20 | (2006.01) |
| H01L 21/44 | (2006.01) |

(52) U.S. Cl.
USPC .............. 257/2; 257/3; 257/4; 257/5; 257/6; 438/658; 438/382

(58) Field of Classification Search
None
See application file for complete search history.

(56) References Cited

U.S. PATENT DOCUMENTS

| 5,707,487 | A  | 1/1998  | Hori et al. |
| 6,939,787 | B2 | 9/2005  | Ohtake et al. |
| 7,023,093 | B2 | 4/2006  | Canaperi et al. |
| 7,238,607 | B2 | 7/2007  | Dunton et al. |
| 7,474,000 | B2 | 1/2009  | Scheuerlein et al. |
| 7,550,380 | B2 | 6/2009  | Elkins et al. |
| 7,786,589 | B2 | 8/2010  | Matsunaga et al. |
| 7,824,956 | B2 | 11/2010 | Schricker et al. |
| 7,829,875 | B2 | 11/2010 | Scheuerlein |
| 7,858,468 | B2 | 12/2010 | Liu et al. |
| 7,968,419 | B2 | 6/2011  | Li et al. |
| 8,088,688 | B1 * | 1/2012 | Herner .......................... 438/658 |
| 8,097,874 | B2 | 1/2012  | Venkatasamy et al. |
| 8,389,971 | B2 | 3/2013  | Chen et al. |

(Continued)

FOREIGN PATENT DOCUMENTS

KR  1020110014248 A  2/2011

OTHER PUBLICATIONS

Suehle et al., "Temperature Dependence of Soft Breakdown and Wear-Out in Sub-3 nm $SiO_2$ Films", 2000, IEEE 00CH37059.38 Annual International Reliability Physics Symposium, San Jose, California, 2000, pp. 33-34.*

(Continued)

*Primary Examiner* — Steven Loke
*Assistant Examiner* — Juanita B Rhodes
(74) *Attorney, Agent, or Firm* — Ogawa P.C.

(57) ABSTRACT

A method for forming a resistive switching device. The method includes providing a substrate having a surface region and forming a first dielectric material overlying the surface region of the substrate. A first wiring structure overlies the first dielectric material. The method forms a first electrode material overlying the first wiring structure and a resistive switching material comprising overlying the first electrode material. An active metal material is formed overlying the resistive switching material. The active metal material is configured to form an active metal region in the resistive switching material upon application of a thermal energy characterized by a temperature no less than about 100 Degree Celsius. In a specific embodiment, the method forms a blocking material interposing the active metal material and the resistive switching material to inhibit formation of the active metal region in the resistive switching material during the subsequent processing steps.

20 Claims, 9 Drawing Sheets

(56) References Cited

U.S. PATENT DOCUMENTS

| | | | |
|---|---|---|---|
| 8,399,307 | B2 | 3/2013 | Herner |
| 2003/0052330 | A1 | 3/2003 | Klein |
| 2004/0192006 | A1 | 9/2004 | Campbell et al. |
| 2004/0194340 | A1 | 10/2004 | Kobayashi |
| 2007/0087508 | A1 | 4/2007 | Herner |
| 2007/0105390 | A1 | 5/2007 | Oh |
| 2009/0256130 | A1 | 10/2009 | Schricker |
| 2010/0012914 | A1 | 1/2010 | Xu et al. |
| 2010/0019310 | A1 | 1/2010 | Sakamoto |
| 2010/0084625 | A1 | 4/2010 | Wicker et al. |
| 2010/0085798 | A1 | 4/2010 | Lu et al. |
| 2010/0090192 | A1 | 4/2010 | Goux et al. |
| 2010/0101290 | A1 | 4/2010 | Bertolotto |
| 2010/0102290 | A1 | 4/2010 | Lu et al. |
| 2010/0157710 | A1 | 6/2010 | Lambertson et al. |
| 2011/0133149 | A1 | 6/2011 | Sonehara |
| 2011/0284814 | A1 | 11/2011 | Zhang |
| 2011/0312151 | A1 | 12/2011 | Herner |
| 2012/0001145 | A1 | 1/2012 | Magistretti et al. |
| 2012/0008366 | A1 | 1/2012 | Lu |
| 2012/0012806 | A1 | 1/2012 | Herner |
| 2012/0012808 | A1 | 1/2012 | Herner |
| 2012/0015506 | A1 | 1/2012 | Jo et al. |
| 2012/0025161 | A1 | 2/2012 | Rathor et al. |
| 2012/0033479 | A1 | 2/2012 | Delucca et al. |
| 2012/0043654 | A1 | 2/2012 | Lu et al. |
| 2012/0074374 | A1* | 3/2012 | Jo .................... 257/4 |
| 2012/0074507 | A1 | 3/2012 | Jo |
| 2012/0250183 | A1 | 10/2012 | Tamaoka et al. |
| 2012/0252183 | A1 | 10/2012 | Herner |

OTHER PUBLICATIONS

Shin et al., "Effect of Native Oxide on Polycrystalline Silicon CMP", Journal of the Korean Physical Society, vol. 54, No. 3, Mar. 2009, p. 1077.*
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al, "Aluminum spiking at contact windows in Al/Ti—W/Si", Appl. Phys. Lett., Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824, dated Jul. 24, 2012.
Notice of Allowance for U.S. Appl. No. 13/532,019, dated Nov. 14, 2012.
Office Action for U.S. Appl. No. 13/564,639, dated Mar. 19, 2013.
John S. Suehle et al., "Temperature dependence of soft breakdown and wear-out in Sub-3 nm $SiO_2$ films", 38th Annual International Reliability Physics Symposium, 2000, pp. 33-39, San Jose, California.
Woonki Shin et al., "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036, dated Jul. 9, 2013.
Office Action for U.S. Appl. No. 13/764,698, dated Jul. 11, 2013.
Office Action for U.S. Appl. No. 13/481,600, dated Sep. 20, 2013.
Office Action for U.S. Appl. No. 13/564,639, dated Dec. 6, 2013.
Office Action for U.S. Appl. No. 13/705,082, dated Sep. 2, 2014.
Notice of Allowance for U.S. Appl. No. 12/835,699, dated Feb. 6, 2012.
Notice of Allowance for U.S. Appl. No. 13/447,036, dated Sep. 29, 2014.

* cited by examiner

BARRIER STRUCTURE FOR A SILVER BASED RRAM AND METHOD

BACKGROUND

The present invention is directed to resistive switching devices. More particularly, embodiments according to the present invention provide a device structure and a method to form a resistive switching device. The resistive switching device is being applied in non-volatile memory device. But it should be recognized that embodiments according to the present invention can have a much broader range of applicability.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

SUMMARY OF THE PRESENT INVENTION

The present invention is directed to resistive switching devices. More particularly, embodiments according to the present invention provide a device structure and a method to form a resistive switching device. The resistive switching device is applied in non-volatile memory devices, but it should be recognized that embodiments according to the present invention can have a much broader range of applicability.

In a specific embodiment, a method for forming a resistive switching device for a non-volatile memory device is provided. The method includes providing a substrate having a surface region and forming a first dielectric material overlying the surface region of the substrate. A first wiring structure is formed overlying the first dielectric material and a first electrode material is formed overlying the first wiring structure. The first electrode material includes a polycrystalline silicon material having a p+ impurity characteristic. In a specific embodiment, the method includes forming a resistive switching material comprising an amorphous silicon material overlying the first electrode material and forming an active metal material overlying the resistive switching material. The active metal material forms an active metal region in the resistive switching material derived from the active metal material upon application of a thermal energy characterized by a temperature no less than about 100 Degree Celsius. In a specific embodiment, an intermediate layer of a barrier or blocking material is formed interposing the active metal material and the resistive switching material to inhibit formation of the active metal region in the resistive switching material during the forming of the active metal material and during forming of the second wiring structure. The method forms a second wiring structure overlying the active metal material.

In a specific embodiment, a device structure for a resistive switching device is provided. The device structure includes a substrate having a surface region and a first dielectric material overlying the surface region of the substrate. The device structure includes a first wiring structure overlying the first dielectric material and a first electrode material overlying the first wiring structure. The first electrode material can include a polycrystalline silicon material (for example, polycrystalline silicon material, or a polycrystalline silicon germanium material) having a p+ impurity characteristic in various embodiment. The device includes a resistive switching material overlying the first electrode material. The resistive switching material can be an amorphous silicon material having an intrinsic semiconductor characteristic in various embodiments. The amorphous silicon material may have impurities in various embodiments, but is not "doped" or made conductive intentionally. The device includes a second electrode material comprising an active metal material overlying the resistive switching material. The active metal material is configured to form an active metal region in the resistive switching material upon application of a thermal energy characterized by a temperature no less than about 100 Degree Celsius. A second wiring structure overlies the active metal material. The second wiring structure is configured to connect the resistive switching device to controlling circuitry on the substrate in certain embodiments. In various embodiments, an intermediary layer of a barrier or blocking material is configured interposing the active metal material and the resistive switching material. The blocking material is configured to inhibit formation of the active metal region in the resistive switching material during the forming of the active metal material and during forming of the second wiring structure. Further, the blocking material is configured to breakdown when a first voltage greater than a threshold voltage is applied to the device. The first voltage further causes the resistive switching material to change from a first resistance state to a second resistance state.

Many benefits are achieved by ways of the present invention over conventional techniques. The present method forms a resistive switching device free from conductive contaminants in the resistive switching material during fabrication. Such conductive contaminants cause undesirable electrical behavior, for example, undesirable electrical connection, high off-state current, and others. Additionally, embodiments according to the present invention use conventional process technologies without modification to the equipment. The present device may be implemented in various standalone and embedded applications. For example, as a configuration bit for a field programmable gate array, code storage, data storage, radiation hardened application, cache, and others. Depending on the embodiment, one or more of these benefits may be achieved. One skilled in the art would recognize other modifications, variations, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability.

Resistive switching devices exploit electrical resistance change of a non-conductive material when a voltage or an electric field is applied. Silicon based switching devices benefit from a material compatibility advantage over other switching devices using materials such as metal oxides in fabrication. However, conventional metal/Si/metal (M/Si/M) type devices require a high operating voltage (usually greater than about 10V) which is not fully controllable and thus reduces the device yield and endurance. Such devices may not be able to further scale down to nanometer scale as required in present applications. Moreover, contaminations and process complexity adversely affect yield and performance of the device. Embodiments according to the present invention provide a method and a resulting device structure for a resistive switching device having desirable switching characteristic and improved device reliability.

Figure 1:
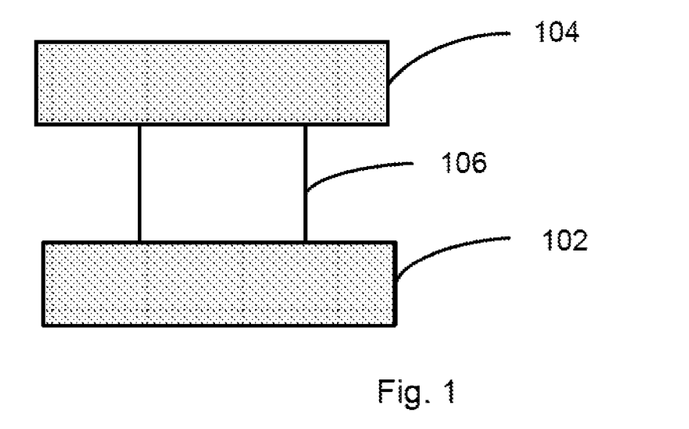
FIG. 1 is a simplified diagram illustrating a resistive switching device according to an embodiment of the present invention.

FIG. 1 is a simplified diagram illustrating a resistive switching device according to various embodiments of the present invention. Referring to FIG. 1, a simplified resistive switching device structure is illustrated. The device includes a first electrode 102, a second electrode 104, and a resistive switching material 106 configured in an intersection region of the first electrode and the second electrode. The second electrode can have a portion that includes an active metal material in a specific embodiment. The active metal material forms a metal region in a portion of the resistive switching material derived from the active metal material upon application of an electric field. Additionally, the resistive switching material is characterized by a resistance dependent on magnitude and polarity of the electric filed applied. The metal region further includes a filament structure comprising one or more metal particles and characterized by a length and a first distance between metal particles and a second distance between filament structure and the first electrode. The filament structure is allowed to extend or to contract depending on an electric field upon application of a potential difference between the first electrode and the second electrode. For proper switching, electrons are allowed to tunnel from the filament structure to the first electrode. The first electrode also functions as a junction material between the resistive switching material and a metal wiring material to provide a suitable band gap transition between the resistive switching material and the metal wiring material.

Figure 1A:
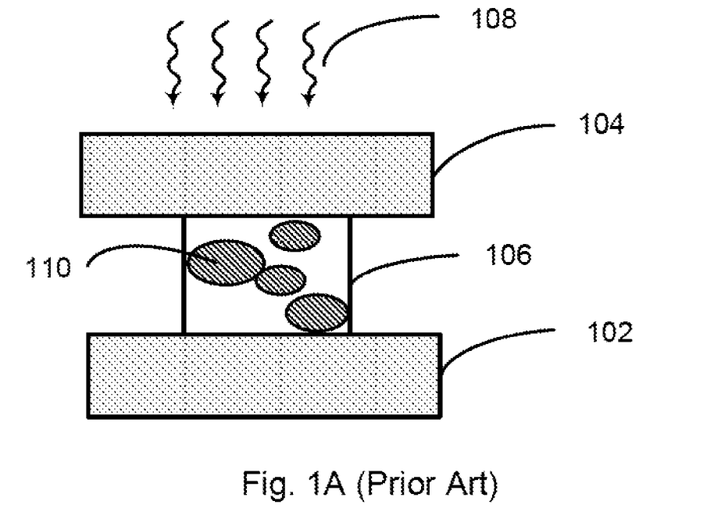
FIG. 1A is a simplified diagram illustrating a resistive switching device fabricated using a conventional technique.

In operation of a resistive switching device, the applied electric field is the primary if not the only driver for the active metal region to form in the resistive switching material. As illustrated in FIG. 1A, diffusion of the active metal material 110 into the resistive material 106 due to thermal effect or concentration gradient during fabrication process 108 is uncontrollable and therefore should be avoided. Embodiments according to the present invention provide a method and a device structure for forming a resistive switching device where the resistive switching material is free from contaminants to cause undesirable electric connection between the first electrode and the second electrode as a result of the fabrication processes.

Figure 2:
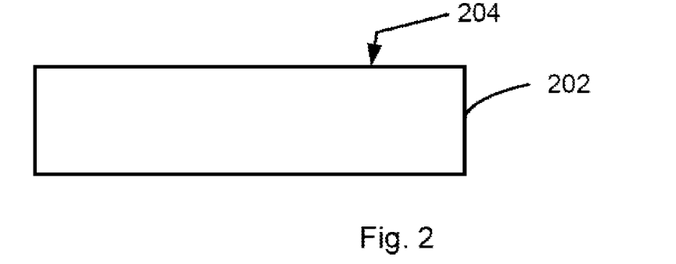
FIG. 2 illustrates a fabricated structure according to various embodiments of the present invention.

FIGS. 2-18 are simplified diagram illustrating a method of forming a resistive switching device according to various embodiments of the present invention. As shown in FIG. 2, a substrate 202 having a surface region 204 is provided. Substrate 202 can be a single crystal silicon material, a silicon on insulator substrate (commonly known as SOI), or a silicon germanium material, and others, depending on the embodiment.

In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memories as described herein. Because the resistive memories are relatively non-volatile, devices such as processors, or the like using such memories may maintain state while power is not supplied to the processors. To a user, such capability would greatly enhance the power-on power-off performance of devices including such processors. Additionally, such capability would greatly reduce the power consumption of devices. In particular, because such memories are non-volatile, the processor need not draw power to refresh the memory states, as is common with CMOS type memories. Accordingly, embodiments of the present invention are directed towards processors or other logic incorporating these memory devices, devices (e.g. smart phones, network devices) incorporating such memory devices, and the like.

Figure 3:
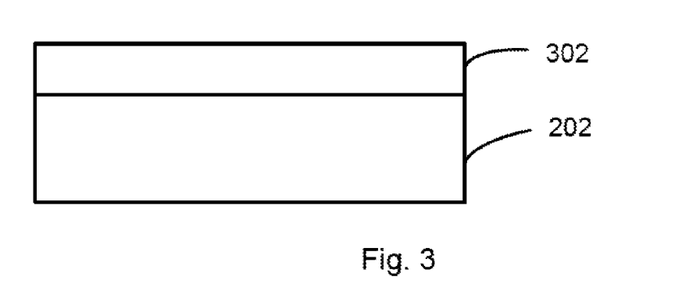
FIG. 3 illustrates a fabricated structure according to various embodiments of the present invention.

Referring to FIG. 3, the method includes forming a first dielectric material 302 overlying substrate 202. First dielectric material 302 can be silicon oxide, silicon nitride, silicon oxynitride, a high K dielectric, a low K dielectric, or a dielectric stack having alternating layer of silicon oxide and silicon nitride (for example an ONO stack), including any combination of these, and others. First dielectric material 302 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 4:
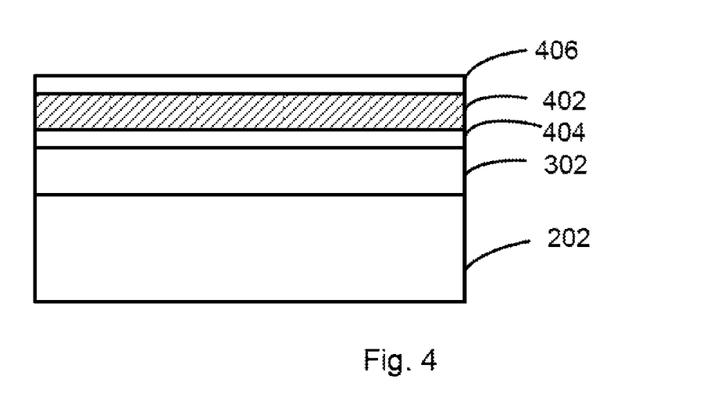
FIG. 4 illustrates a fabricated structure according to various embodiments of the present invention.

As shown in FIG. 4, the method includes forming a first wiring material 402 overlying first dielectric material 302. First wiring material 402 can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments. In certain embodiments, a first adhesion material 404 is first formed overlying the first dielectric material before deposition of first wiring material 402 to promote adhesion of first wiring material 402 to first dielectric material 302. A diffusion barrier material 406 may also be formed overlying the metal material to prevent the metal material to contaminate other portions of the device in certain embodiments. Diffusion barrier material 406 and first adhesion material 404 may each include titanium, titanium nitride, tungsten nitride, tantalum nitride, and others. In other embodiments, diffusion barrier material 406 may not be needed.

Figure 5:
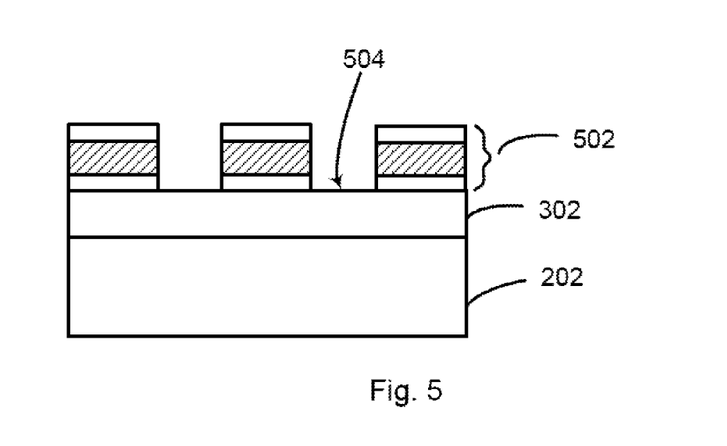
FIG. 5 illustrates a fabricated structure according to various embodiments of the present invention.

As shown in FIG. 5, the method subjects the first wiring material to a first pattern and etch process to form one or more first wiring structures 502. The one or more first wiring structures are configured to spatially extend in a first direction in certain implementation. The first pattern and etch process also expose a portion 504 of the first dielectric material, as shown. The first pattern and etch process includes depositing a masking layer, for example a photoresist material, a hard mask, and others, and using the masking layer to etch the first wiring material (including the diffusion barrier material and first adhesion material, if use) to form the pone or more first wiring structure 502.

Figure 6:
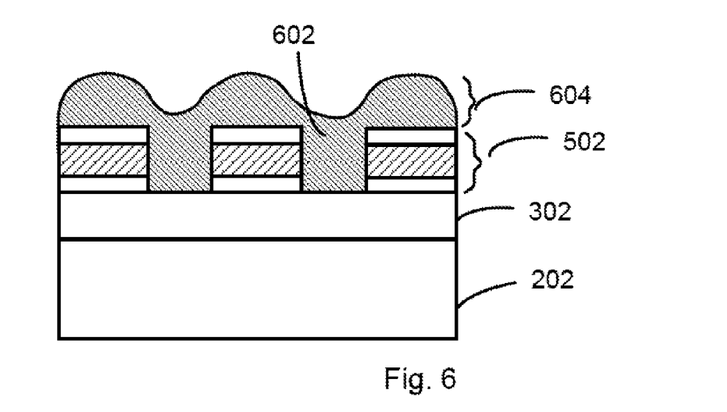
FIG. 6 illustrates a fabricated structure according to various embodiments of the present invention.

Referring to FIG. 6, a second dielectric material 602 is formed overlying the one or more first wiring structure and to fill a gap between the one or more first wiring structures to isolate the one or more first wiring structures. Second dielectric material 602 further forms a thickness 604 overlying the first wiring structure in a specific embodiment. Second dielectric material 602 can be silicon oxide, silicon nitride, silicon oxynitride, a high K dielectric, a low K dielectric, or a dielectric stack having alternating layer of silicon oxide and silicon nitride (for example an ONO stack), including any combination of these, and others. Second dielectric material 602 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Figure 7:
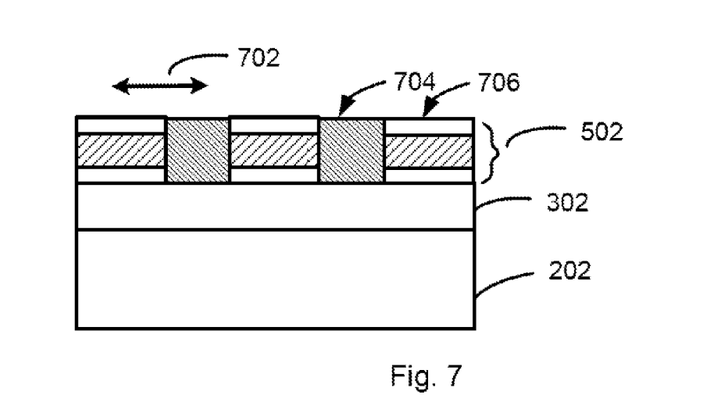
FIG. 7 illustrates a fabricated structure according to various embodiments of the present invention.

As shown in FIG. 7, second dielectric material 602 is subjected to a planarizing process 702 to form a planarized dielectric surface 704 and to expose a surface region 706 of the first wiring structure. Planarizing process 702 can be a chemical mechanical polishing (CMP) process, or an etch back process, or a combination depending on the embodiment.

Figure 8:
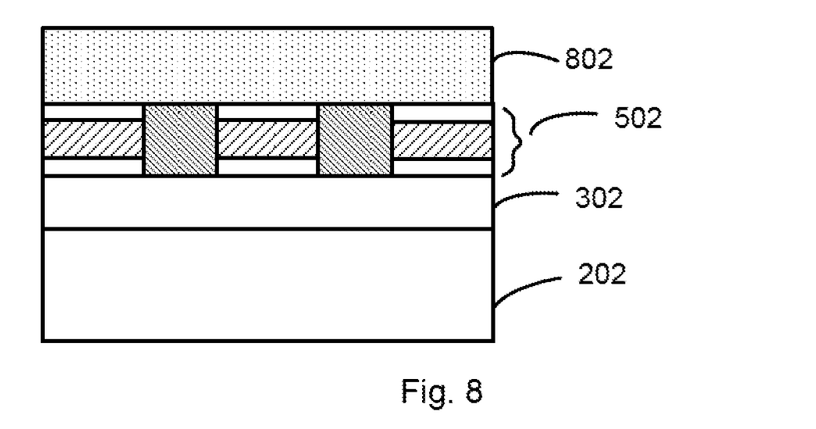
FIG. 8 illustrates a fabricated structure according to various embodiments of the present invention.

Referring to FIG. 8. In various embodiments, a first electrode material 802 is deposited overlying the exposed surface region of the first wiring structure and the planarized surface of the second dielectric material. First electrode material 802 can be a polycrystalline silicon material. In a specific embodiment, the polycrystalline silicon material has a p+ impurity characteristic. Depending on the application, the p+ impurity can be provided using boron, aluminum, gallium, indium, and other suitable p type impurity species. Again depending on the implementation, the polycrystalline silicon material may be deposited using techniques such as chemical vapor deposition including low pressure chemical vapor deposition, plasma enhanced chemical vapor deposition, atomic layer deposition, and others. Silicon precursors such as silane, a suitable chlorosilane in a presence of a reducing gas (for example, hydrogen) may be used. In other embodiments, the polycrystalline silicon material may be deposited using a physical vapor deposition technique from a suitable silicon target material. The p+ type impurity species can be co-deposited during deposition process (chemical vapor deposition or physical vapor deposition) or using an implantation process after deposition. First electrode material 802 can be other suitable semiconductor material in a specific embodiment.

In certain embodiments, the semiconductor material can be a polycrystalline silicon germanium (poly-SiGe) material. In various embodiments, the polycrystalline silicon germanium material can be doped with a suitable impurity species to have a desirable conductivity. The polycrystalline silicon germanium material can be deposited using a chemical vapor deposition process such as a low pressure chemical vapor deposition process, a plasma enhanced chemical vapor deposition process, atomic layer deposition (ALD) and others. Depending on the application, precursors such as silane and germane in a suitable carrier gas may be used. The polycrystalline silicon germanium material can have a p+ impurity characteristic provided by dopants such as boron, aluminum, gallium, indium, and others. Deposition temperature can range from about 400 Degree Celsius to about 490 Degree Celsius and the as deposited silicon germanium material is crystalline and has a desirable conductivity characteristic without further anneal. Other deposition methods may also be used depending on the embodiment.

Depending on the application, a seed layer material (not shown) may be formed overlying the first wiring material before deposition of the first electrode material. The seed layer material can include a thin layer of silicon material (about 40 Angstrom to about 120 Angstroms) deposited at temperatures no greater than about 430 Degree Celsius (for example, about 250 Degree Celsius to about 450 Degree Celsius) to promote crystallization of the first electrode material.

Figure 9:
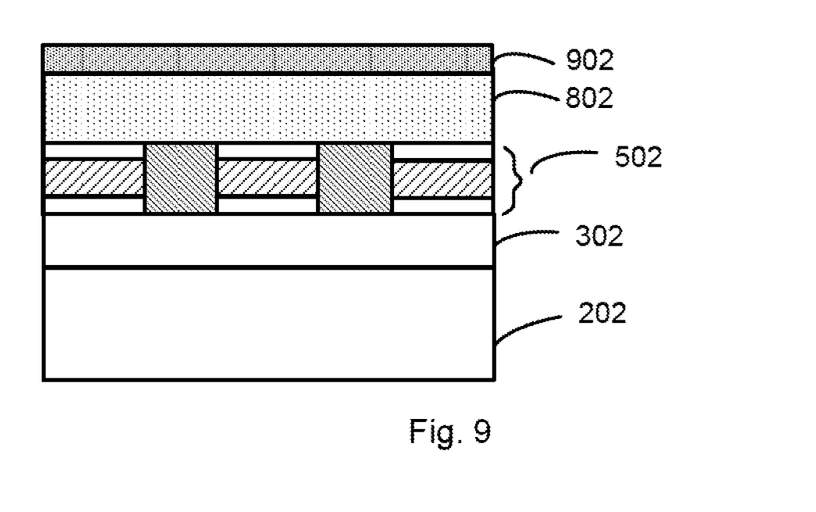
FIG. 9 illustrates a fabricated structure according to various embodiments of the present invention.
Figure 10:
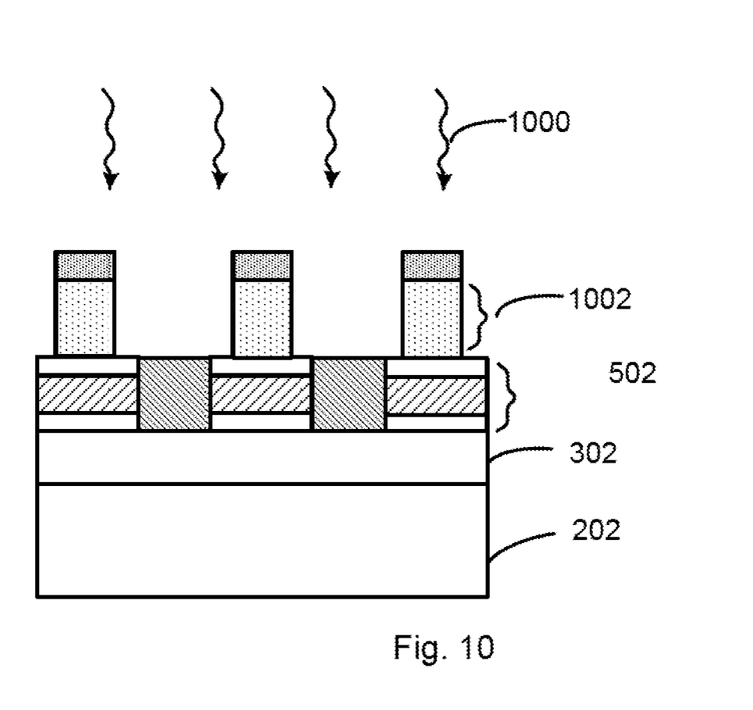
FIG. 10 illustrates a fabricated structure according to various embodiments of the present invention.

As shown in FIG. 9, a hardmask material 902 is deposited overlying the first electrode material 802. Hardmask material 902 can be a dielectric material, for example, silicon oxide, silicon nitride, silicon oxynitride, alternating layers of silicon oxide and silicon nitride (for example, ONO) and others. Hardmask material 902 and the first electrode material 802 are subjected to a second pattern and etch process to form a plurality of first structures 1002 as illustrated in FIG. 10. Each of the plurality of first structures is configured overlying and in electrical and physical contact with the first wiring structure, as shown.

Figure 11:
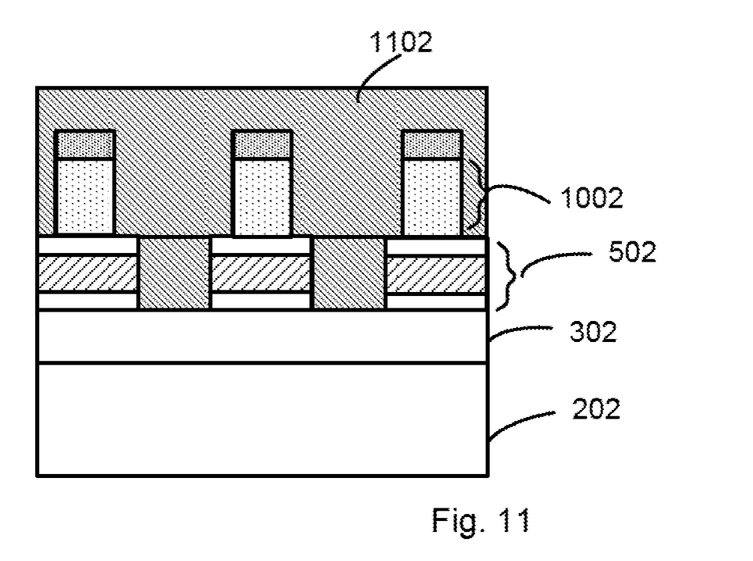
FIG. 11 illustrates a fabricated structure according to various embodiments of the present invention.
Figure 12:
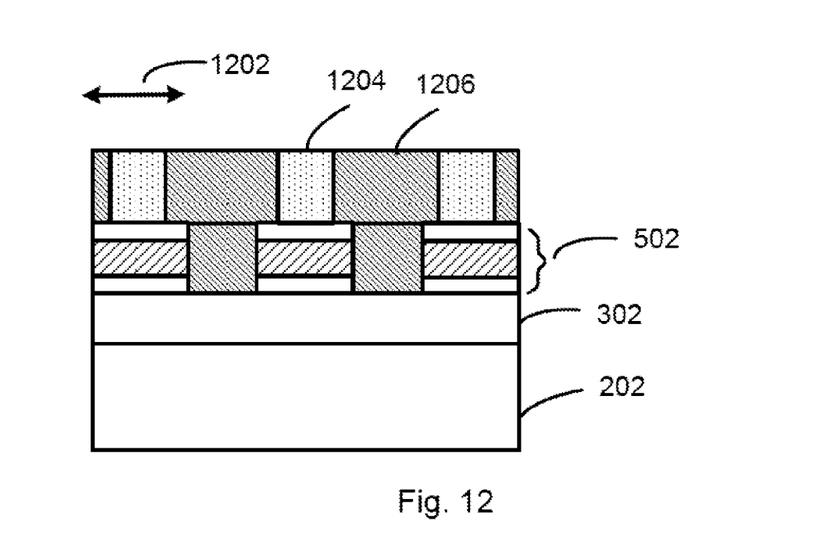
FIG. 12 illustrates a fabricated structure according to various embodiments of the present invention.

Referring now to FIG. 11, the method includes depositing a third dielectric material 1102 overlying the plurality of first structures and filling a gap between each of the plurality of first structures. The third dielectric material may be silicon oxide, silicon nitride, silicon oxynitride, and others. In certain implementations, third dielectric material can be silicon oxide deposited using techniques such as chemical vapor deposition process, including plasma enhanced chemical vapor deposition process, low pressure chemical vapor deposition process, sub atmospheric chemical vapor deposition process, and others. Third dielectric material 1102 is then subjected to a planarizing process 1202 to expose a top surface region 1204 of the first structure. Top surface region 1204 includes a top surface region of the first electrode material in various embodiments. In certain implementations, planarizing process 1202 can remove a portion of the first electrode material. Deposition thickness of the first electrode material would have to account for the removal.

Figure 13:
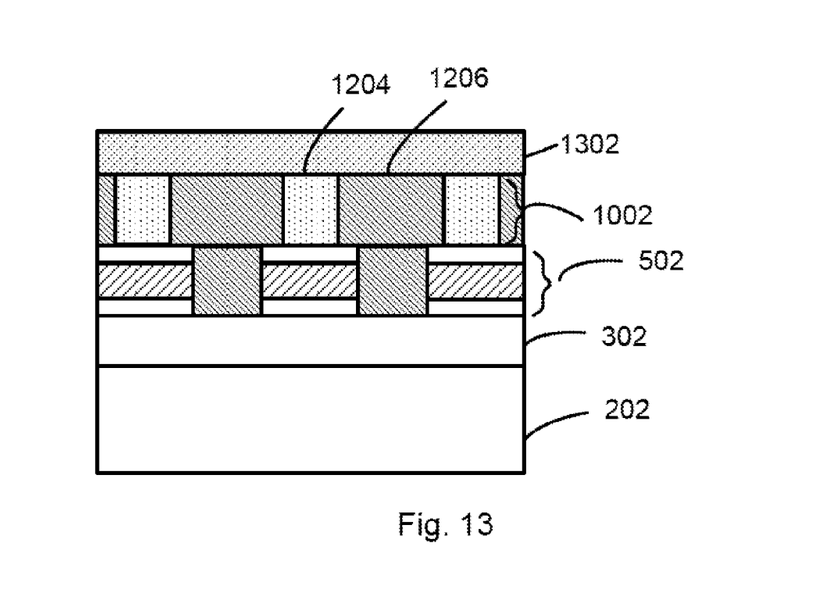
FIG. 13 illustrates a fabricated structure according to various embodiments of the present invention.

As shown in FIG. 13, the method includes forming a resistive switching material 1302 overlying top surface region of the first structure, including top surface region 1204 of the first electrode material and the exposed surface 1206 of the third dielectric material. Depending on the application, the top surface region of the first electrode material may be subjecting to a cleaning step to remove contaminants from the planarizing process, and others. The amorphous silicon material can be formed using a chemical vapor deposition process such as low pressure chemical vapor deposition process, plasma enhanced chemical vapor deposition process, and others. The chemical vapor deposition process can use silicon precursor such as silane, a suitable chlorosilane in presence of a reducing species (for example, hydrogen), and others. The deposited amorphous silicon is not intentionally doped to maintain the intrinsic semiconductor characteristic during deposition or after deposition in a specific embodiment. Deposition temperature ranges from about 250 Degree Celsius to about 400 Degree Celsius depending on the implementation.

The resistive switching material 1302 is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of polysilicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material 1302 is substantially free of any p-type, n-type or metallic dopants, i.e. the amorphous silicon material is undoped.

In yet another embodiment, the resistive switching material/amorphous silicon material 1302 may be formed from an upper region of the p+ polycrystalline silicon bearing layer 1002 using an Argon, Silicon, Oxygen plasma etch, or the like. For instance, a plasma etch may use a bias power within a range of approximately 30 watts to approximately 120 watts to convert an upper region of the polysilicon 1002 into a non-conductive amorphous silicon having p-type impurities (from the original polycrystalline silicon bearing layer 1302.

Figure 14:
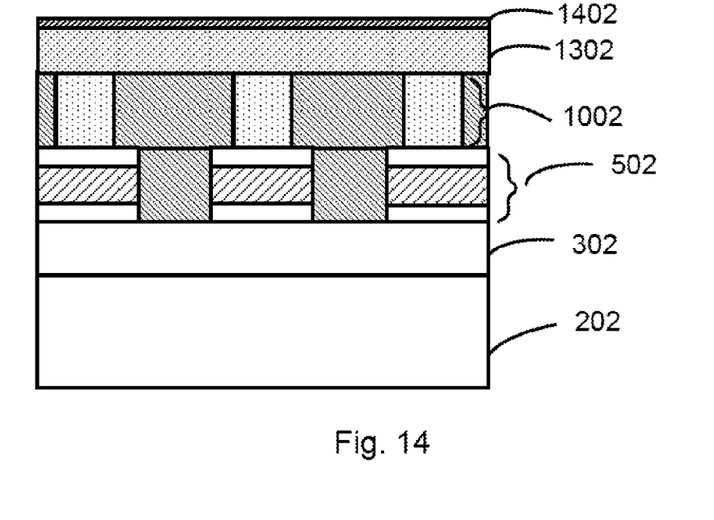
FIG. 14 illustrates a fabricated structure according to various embodiments of the present invention.

Referring to FIG. 14, the method includes forming a blocking material 1402 overlying the resistive switching material 1302. For amorphous silicon as the resistive switching material, the blocking material 1402 can be a silicon oxide material. Depending on the implementation, the silicon oxide material may be a native oxide formed overlying amorphous silicon material surface 1204 during exposure of the amorphous silicon material to the atmosphere. In some embodiments, the native oxide can be used without modification as the blocking material 1402, and in other embodiments, the native oxide may be subjected to a cleaning process (for example, sputter clean using argon, or a chemical clean in a solution comprising a hydrofluoric acid specie, and others) to control thickness to form the blocking material 1402.

In other embodiments, the blocking material 1402 may be a chemically grown oxide formed by subjecting the amorphous silicon material 1302 to an oxidizing species in a reaction chamber at a suitable oxidizing temperature. The oxidizing species can be oxygen, ozone, nitrous oxide, in a suitable carrier gas, depending on the application. Depending on the implementation, the silicon oxide formed may be further modified using techniques such as controlled thinning in a hydrofluoric acid vapor to form the blocking material 1402. Other modification method may include a chemical modification, for example, using an isopropyl alcohol (IPA), in a liquid state or a vapor state to form the blocking material 1402.

Depending on the embodiment, other suitable blocking materials may be used. These other blocking materials can include silicon nitride, high K dielectric such as hafnium oxide, or low K dielectric such as fluorine-doped silicon oxide, carbon-doped silicon oxide, and others, deposited using a deposition process. In certain implementation, porous dielectric material derived from aforementioned low k dielectric material, silicon oxide, or silicon nitride may also be used. Depending on the application deposition techniques such as atomic layer deposition process, chemical vapor deposition process, physical vapor deposition process, and others, may be used.

Figure 15:
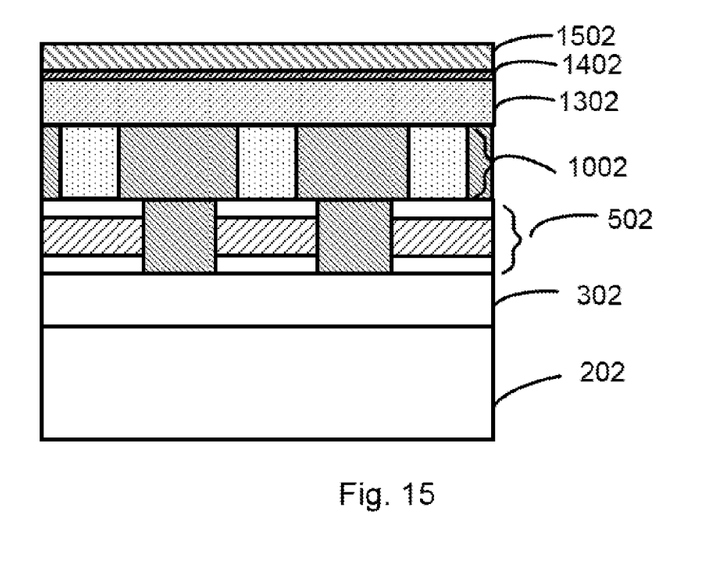
FIG. 15 illustrates a fabricated structure according to various embodiments of the present invention.

Referring to FIG. 15, the method includes depositing an active metal material 1502 overlying the blocking material. For amorphous silicon material as the resistive switching material 1302, active metal material 1502 can be selected from silver, gold, palladium, platinum, aluminum, chromium, vanadium, and others. The active metal material 1502 is selected to have a desirable diffusivity characteristic in the resistive switching material in a presence of a suitable electric field. In a specific embodiment, a positive voltage greater than a threshold voltage applied to the active metal material with respect to the first wiring structure causes the blocking material to breakdown and the active metal material to migrate into a portion of the amorphous silicon material to cause the amorphous silicon material 1302 to be in a low resistance state (or on state) and an on-state current flows. The blocking material 1402 functions as a diffusion barrier material during fabrication so that any high temperature process after deposition of the active metal material 1502 would not cause the active metal material 1502 to form within the resistive switching material 1302 to cause electrical connection between the terminals through the active metal material in the resistive switching material during the fabrication process.

In some embodiments, as described, a thin layer of barrier material 1402, e.g. oxide, nitride, is formed prior to the deposition of the active metal (e.g. silver) material on top of the amorphous silicon/resistive switching material. This interposing thin layer of material may be naturally or specifically grown or formed. In some embodiments, one or more etch operations (e.g. HF etch, Argon etch) may help control the thickness of this layer. In some embodiments, the thickness of the barrier material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a barrier structure (a thin layer of material (e.g. oxide, nitride, barrier) and a thin layer of amorphous silicon), and the silver material.

Figure 16:
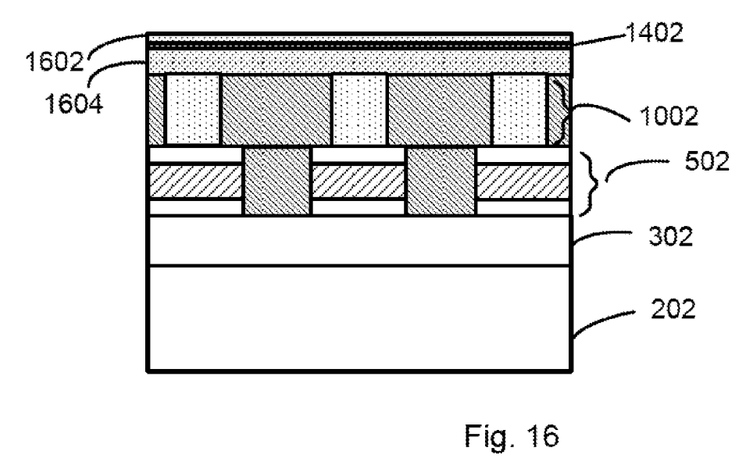
FIG. 16 illustrates a fabricated structure according to various embodiments of the present invention.

In some embodiments, blocking material 1402 may be formed interposing a first portion 1602 of the resistive switching material and a second portion 1604 of the resistive switching material, as shown in FIG. 16. In this implementation, the active metal material would not form in second portion 1604 due to thermal diffusion in subsequent process steps. Additionally, the active metal material can have an ohmic contact with second portion 1602 of the resistive switching material.

Figure 17:
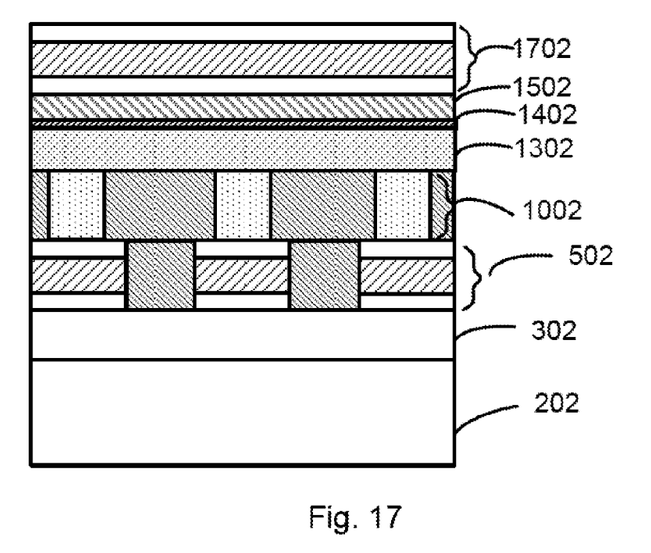
FIG. 17 illustrates a fabricated structure according to various embodiments of the present invention.

As shown in FIG. 17, the method includes forming a second wiring material 1702 overlying active metal material 1502. Second wiring material 1702 can be copper, tungsten, or aluminum depending on the application. Depending on the implementation, the active metal material (for example, silver) may be used as the top wiring material. The second wiring material 1702 can further include one or more diffusion barrier layer material or adhesion material to promote adhesion of the second wiring material to the second dielectric material and the active metal material. The one or more diffusion barrier material or adhesion material further inhibit diffusion of the active metal material to prevent contamination to other parts of the device. Again depending on the implementation, the one or more diffusion barrier material can include titanium, titanium nitride, tungsten, titanium tungsten, or a combination, and others.

Figure 18:
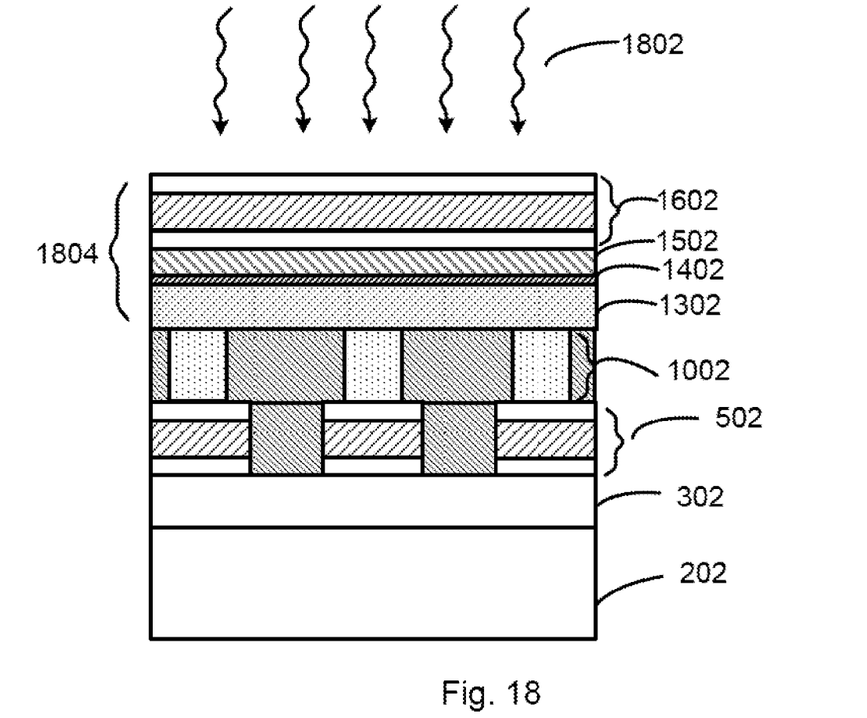
FIG. 18 illustrates a fabricated structure according to various embodiments of the present invention.

Referring to FIG. 18, the method subjects a stack of material including the resistive switching material 1302, blocking material 1402, active metal material 1502, and second wiring material 1602 to a third pattern and etch process 1802 to form a plurality of second structures 1804. Second structure 1804 including resistive switching material 1302, active metal material 1402, and second wiring material 1502 is configured to spatially extend in a second direction (right to left in FIG. 18) orthogonal to the first direction (in and out in FIG. 18) in certain embodiments.

Again, depending on the application, other device structures may be implemented. For example, the resistive switching material 1302 (for example, an intrinsic amorphous silicon material) and the first electrode material 1002 (for example, the p+ polysilicon material) may form a single pillar structure, and the active metal material 1502 (for example, the silver material) and the second wiring material can 1702 form the second wiring structure 25 concurrently. In another embodiment, the resistive switching material 1302 and the active metal material 1502 can concurrently form a second structure. In yet another embodiment, the active metal 1502 can be configured in an opening structure (for example, a via structure) overlying the resistive switching material 1302. In all these implementations, a blocking structure 1402 is formed interposing the active metal material 1502 and the resistive switching material 1302 to retard formation of the active metal material in the resistive switching material during fabrication.

Though the present invention has been exemplified in various embodiments, it is to be understood that the examples and embodiment described herein are for illustrative purpose only and that various modifications or alternatives in light thereof will be suggested to persons skilled in the art and are to be included within the spirit and purview of this application and scope of the appended claims.

What is claimed is:

1. A method for forming a resistive switching device for a non-volatile memory device, comprising:
   providing a substrate having a surface region;
   forming a first dielectric material overlying the surface region of the substrate;
   forming a first wiring structure overlying the first dielectric material;
   forming a first electrode material comprising a silicon bearing material having a p+ impurity characteristic overlying the first wiring structure;
   forming a resistive switching material comprising an amorphous silicon material overlying the first electrode material;
   forming an active metal material overlying the resistive switching material, the active metal material forming an active metal region derived from the active metal material in a portion of the resistive switching material upon application of a thermal energy characterized by a temperature no less than about 100 Degree Celsius;
   forming a second wiring structure overlying the active metal material; and
   forming a blocking structure interposing and contacting the active metal material and the resistive switching material to inhibit formation of the active metal region in the portion of the resistive switching material during the forming of the active metal material and during forming of the second wiring structure.

2. The method of claim 1
wherein the blocking structure is configured to breakdown upon application of a first voltage; and
wherein the first voltage further causes the active metal region to form in the portion of the resistive switching material.

3. The method of claim 1 wherein the first wiring structure comprises a metal material selected from a group consisting of: copper, aluminum, tungsten, and silver.

4. The method of claim 1 wherein the silicon bearing material having a p+ impurity characteristic is selected from a group consisting of: a p+ polysilicon material, and p+ polysilicon germanium material.

5. The method of claim 1 wherein the amorphous silicon material has an intrinsic semiconductor characteristic and is not intentionally doped during deposition or after deposition.

6. The method of claim 1 wherein the active metal material is selected from a group consisting of: silver, gold, palladium, platinum, vanadium, aluminum, nickel, and chromium.

7. The method of claim 1 wherein the blocking structure comprises a dielectric material selected from a group consisting of: silicon oxide, silicon nitride, a high K dielectric material, and a low K dielectric material, and combinations thereof.

8. The method of claim 1 wherein a thickness of the blocking structure is within a range of approximately 2 nanometers to approximately 5 nanometers.

9. The method of claim 1 wherein the forming the blocking structure comprises growing a silicon oxide layer on a top surface of the amorphous silicon material.

10. The method of claim 9
wherein the forming the blocking structure further comprises performing an etch upon the silicon oxide layer; and
wherein the forming the active metal material comprises forming the active metal material overlying a top surface of the silicon oxide layer.

11. A device structure for a resistive switching device; comprising:
a substrate having a surface region;
a first dielectric material overlying the surface region of the substrate;
a first wiring structure overlying the first dielectric material;
a first electrode material comprising a polycrystalline silicon material having a p+ impurity characteristic overlying the first wiring structure;
a pillar structure formed at least in part from the first electrode material;
a second dielectric material disposed about the pillar structure, wherein a top surface of the first electrode material is exposed;
a resistive switching material comprising an amorphous silicon material overlying the top surface of the first electrode material;
a second electrode material comprising an active metal material overlying the resistive switching material;
a second wiring structure overlying the active metal material; and
a blocking structure interposing and contacting the active metal material and the resistive switching material configured to inhibit formation of an active metal region of the active metal material within the resistive switching material in response to a temperature less than at least about 100 degrees Celsius.

12. The device of claim 11 wherein the first electrode material, the resistive switching material, the blocking structure, and the second electrode material form the resistive switching device.

13. The device of claim 11 wherein the amorphous silicon material has an intrinsic semiconductor characteristic and is not intentionally doped with impurities.

14. The device of claim 11 wherein the blocking structure is configured to break down upon application of a first voltage and the first voltage is further configured to cause the active metal material derived from the second electrode to form the active metal region within at least a portion of the resistive switching material.

15. The device of claim 11 wherein the blocking structure comprises a dielectric material selected from a group consisting of: silicon oxide, silicon nitride, a high K dielectric material, and a low K dielectric material, and combinations thereof.

16. The device of claim 11 wherein a thickness of the blocking structure is within a range of approximately 10 to 50 angstroms.

17. The device of claim 11 wherein a thickness of the blocking structure is within a range of approximately 20 to 30 angstroms.

18. The device of claim 11 wherein the blocking structure comprises a native oxide grown on top of the amorphous silicon material.

19. The device of claim 11 wherein the active metal material is silver.

20. A resistive memory device formed according to a method comprising:
forming a first wiring structure overlying a first dielectric material and a substrate, wherein the substrate is selected from a group consisting of: monocrystalline silicon material, a silicon germanium material, and a silicon on insulator (SOI) substrate;
forming a first electrode material comprising a silicon bearing material having a p-type impurity characteristic overlying the first wiring structure, wherein the silicon bearing material is selected from a group consisting of: p-type polysilicon, and a p-type silicon germanium alloy;
forming a pillar structure from the first electrode material;
forming a second dielectric material around the pillar structure, exposing a top surface of the first electrode material;
forming a resistive switching material comprising a non-conductive amorphous silicon material in contact with the top surface of the first electrode material, wherein the non-conductive amorphous silicon material is not intentionally doped with impurities;
forming an intermediary layer overlying and contacting the resistive switching material, wherein the intermediary layer comprises a material selected from a group consisting of: silicon oxide, silicon nitride, a high K dielectric material, and a low K dielectric material;
forming an active metal material overlying and contacting the intermediary layer, wherein the active metal material is selected from a group consisting of: silver, gold, palladium, platinum, vanadium, aluminum, nickel, and chromium; and forming a second wiring structure overlying the active metal material.

* * * * *